United States Patent
Sakai et al.

(10) Patent No.: US 8,217,330 B2
(45) Date of Patent: Jul. 10, 2012

(54) SOLID-STATE IMAGING APPARATUS

(75) Inventors: Seiichirou Sakai, Ebina (JP); Yuu Arishima, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 211 days.

(21) Appl. No.: 12/819,916

(22) Filed: Jun. 21, 2010

(65) Prior Publication Data

US 2010/0327149 A1 Dec. 30, 2010

(30) Foreign Application Priority Data

Jun. 24, 2009 (JP) ................. 2009-149804

(51) Int. Cl.
*H01L 27/00* (2006.01)
*H01L 31/14* (2006.01)

(52) U.S. Cl. .......... 250/208.1; 250/214.1; 257/292; 257/E27.133; 348/294

(58) Field of Classification Search ........ 250/208.1, 250/214.1; 257/291, E27.131–E27.133; 348/294, 299, 314

See application file for complete search history.

(56) References Cited

U.S. PATENT DOCUMENTS

| 2006/0043440 | A1 | 3/2006 | Hiyama | |
|---|---|---|---|---|
| 2006/0044434 | A1* | 3/2006 | Okita et al. | 348/294 |
| 2008/0029793 | A1 | 2/2008 | Watanabe et al. | |

FOREIGN PATENT DOCUMENTS

| JP | 2006-073733 A | 3/2006 |
|---|---|---|
| JP | 2006-086241 A | 3/2006 |
| JP | 2008-041726 A | 2/2008 |

* cited by examiner

*Primary Examiner* — Kevin Pyo
(74) *Attorney, Agent, or Firm* — Canon U.S.A., Inc. IP Division

(57) ABSTRACT

An apparatus includes a pixel region having disposed therein in a matrix form a plurality of conversion components, an amplifier transistor which amplifies a signal from the plurality of conversion components, a reset transistor which sets the potential of an input portion of the amplifier transistor to a reset potential, and a select transistor which is connected in series to the amplifier transistor and selects and reads the amplified signal, and well contact regions which are provided within the pixel region. Each of the well contact regions is neighboring to a drain region of the reset transistor, and the drain region of the reset transistor has a lower impurity concentration than the impurity concentration in the source and drain regions of the select transistor.

10 Claims, 5 Drawing Sheets

SOLID-STATE IMAGING APPARATUS

BACKGROUND OF THE INVENTION

1. Field of the Invention

The present invention relates to MOS active pixel solid-state imaging apparatuses including a plurality of photoelectric conversion components.

2. Description of the Related Art

In the past, there have been known pixels in a MOS active pixel solid-state imaging apparatus (or APS) configured as disclosed in Japanese Patent Laid-Open No. 2006-086241 (called Patent Document 1 hereinafter). Patent Document 1 discloses that a floating diffusion region (FD region) has a lower impurity concentration than the impurity concentration in a drain region of a reset transistor in order to reduce the parasitic capacitance at a node to which the floating diffusion of a pixel is connected.

Japanese Patent Laid-Open No. 2006-073733 (called Patent Document 2 hereinafter) discloses sharing an FD, an amplifier transistor and a reset transistor between a plurality of pixels to reduce the number of transistors per pixel in order to address reduction of the dimensions of pixels due to the increase in number of pixels and a lower sensitivity due to the reduction of dimensions of pixels.

Japanese Patent Laid-Open No. 2008-041726 (called Patent Document 3 hereinafter) discloses a configuration of an apparatus including transistors in a pixel and peripheral circuit, wherein an impurity concentration in source and drain regions of each of the transistors in the pixels is lower than those of the peripheral circuit. This configuration may suppress the generation of hot carriers.

Since each of the pixels in an APS has more transistors, it is important to reduce the area occupied by the transistors as much as possible so as to raise the fill factor of the pixel. In addition to a photoelectric conversion component, a pixel may further include components (regions) such as an FD region, an amplifier transistor, a reset transistor, a select transistor, and a well contact region. The well contact region includes a region of the opposite conduction type of those of the FD and source and drain regions of the transistors. The well contact region is a region for supplying reference voltage to a well providing a channel part of transistors in a pixel.

One way to reduce the area to be occupied by the regions excluding a photoelectric conversion component in a pixel may be to dispose the amplifier transistor and the select transistor within the same active region. The present inventor has studied how the components of a pixel are disposed on four sides surrounding a photoelectric conversion component in the configuration.

First, the amplifier transistor and select transistor occupy a neighboring region of a first side of the photoelectric conversion component. This is because the amplifier transistor and select transistor are electrically connected in series and disposed closely for reduction of wiring resistance and the size of the layout. The FD occupies a region in the vicinity of a second side. Since the symmetry of the pixel layout affects on image quality, the components are disposed symmetrically with each other with respect to a neighboring row or column. From this viewpoint, the FD in a neighboring row or column occupies a region in the vicinity of the third side opposed to the second side.

The reset transistor and well contact region are disposed on the remaining fourth side. As a result, the reset transistor may sometimes have a source region or a drain region closely to a well contact region. As described above, the source and drain regions of the transistor are regions having a conduction type which is opposite to that of the well contact region, and thus form PN junctions. The reduction of pixel dimensions reduces the distance between the source and drain regions of the reset transistor and the well contact region. For this reason, the electric field to be applied to the PN junction gets stronger, and a leak current occurs and flows in the opposite direction. Sometimes, light may be emitted therefrom. A photodiode may detect the flow of charges upon light emission, and thus, the pixel having the photodiode is observed as a point defect.

On the other hand, the configuration as disclosed in Patent Document 3 in which source and drain regions of all MOS transistors within a pixel have a lower impurity concentration may be considered to moderate the electric field.

However, a lower impurity concentration in source and drain regions present on a path where current for reading signals flows increases the resistance. The resistance may cause a voltage drop and reduces the dynamic range. Provided on a path where current for reading signals flows are the amplifier transistor and the select transistor.

Having described up to this point by taking the disposition of the components of a pixel as an example, it is not limited to the described example. The situation may occur when one of source and drain regions of the reset transistor is disposed closely to the well contact region.

In view of the situation, the present invention can moderate the electric field between a reset transistor and a well contact caused by reduction of pixel dimensions, without narrowing the dynamic range, when a plurality of photoelectric conversion components share a pixel readout circuit.

SUMMARY OF THE INVENTION

The present invention provides an apparatus including a pixel region having disposed therein in a matrix form unit cells including a plurality of conversion components, an amplifier transistor which amplifies a signal based on signal charges occurring in the plurality of conversion components, a reset transistor which sets the potential of an input portion of the amplifier transistor to a reset potential, and a select transistor which is connected in series to the amplifier transistor and selects and reads the amplified signal, and a plurality of well contact regions which are provided within the pixel region and supply a reference voltage to a well providing a channel part of the amplifier transistor, reset transistor, and select transistor, wherein each of the well contact regions is neighboring to a drain region of the reset transistor through an isolation region having a channel stop region below, and at least one of the source and drain regions of the reset transistor has a lower impurity concentration than the impurity concentration in the source and drain regions of the select transistor.

Further features of the present invention will become apparent from the following description of exemplary embodiments with reference to the attached drawings.

The accompanying drawings, which are incorporated in and constitute a part of the specification, illustrate embodiments of the invention and, together with the description, serve to explain the principles of the invention.

DESCRIPTION OF THE EMBODIMENT

With reference to drawings, an embodiment of the present invention will be described. The following descriptions assume that signal charges are electrons. When signal charges are holes, the conduction type of a semiconductor region are the opposite conduction type.

Figure 1:
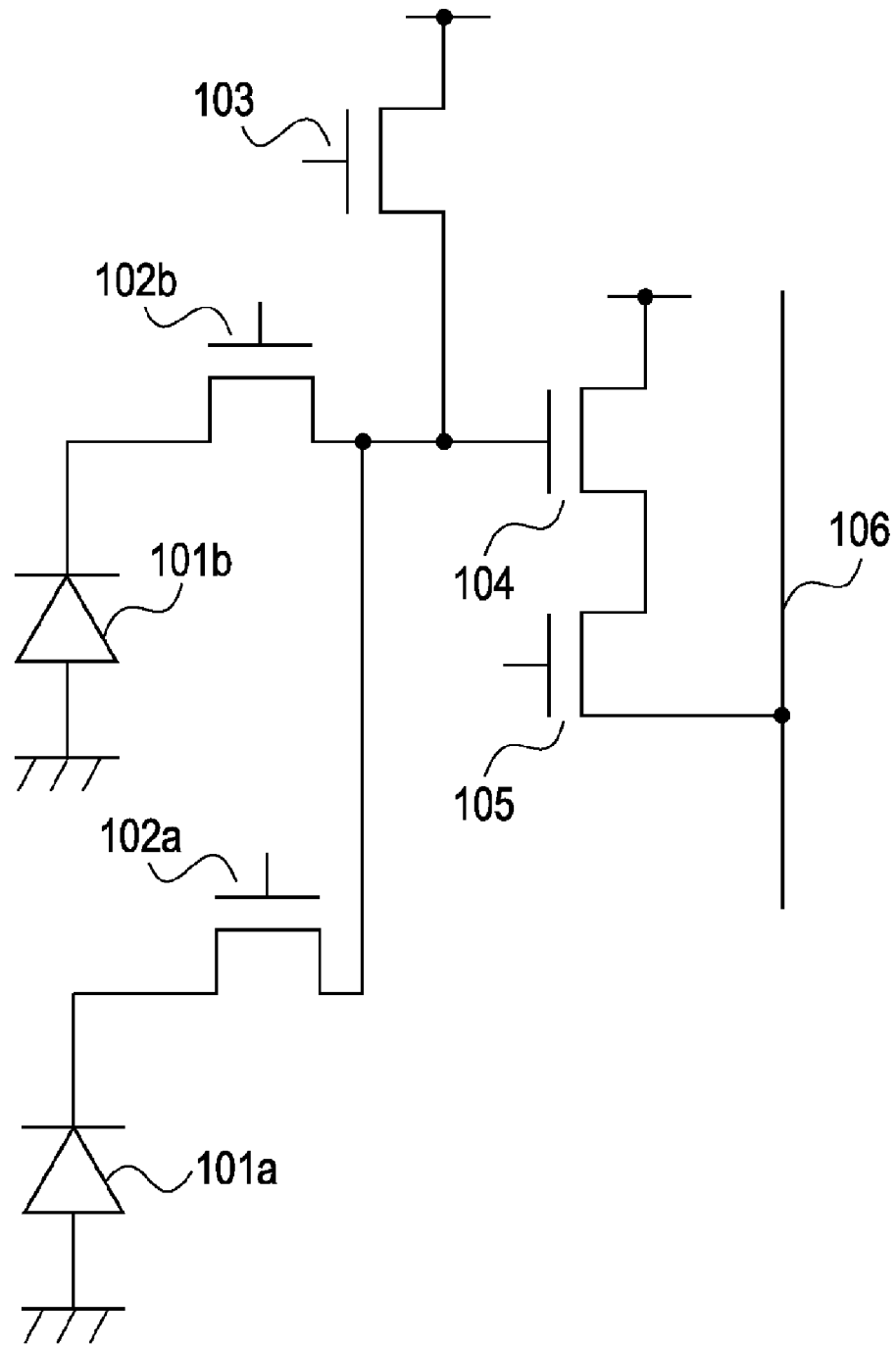
FIG. 1 is an equivalent circuit diagram of a solid-state imaging apparatus of the present invention.

FIG. 1 illustrates an example of a pixel circuit of the present invention. In the example, two photoelectric conversion components share an amplifier transistor. In other words, a plurality of photoelectric conversion components share one amplifier transistor.

FIG. 1 illustrates photodiodes 101a and 101b which are photoelectric conversion components, transfer transistors 102a and 102b which function as transfer switches, a reset transistor 103, am amplifier transistor 104, and a select transistor 105. FIG. 1 further illustrates a vertical signal line 106. The unit cells including those components are disposed in a matrix to form a pixel region.

The photodiodes 101a and 101b have anodes connected to a grounding link and cathodes connected to sources of the transfer transistors 102a and 102b. Alternatively, the sources of the transfer transistors may also function as the cathodes of the photodiodes.

The transfer transistors 102a and 102b have drains forming FDs and gates connected to a transfer control line. The transfer transistors are provided in association with the photoelectric conversion components and transfer signal charges occurring in the photoelectric conversion components to an input portion of the amplifier transistor, which will be described later.

The reset transistor 103 has a drain connected to a power line VDD, a source connected to the FDs, and a gate connected to a reset control line. The reset transistor sets the potential at the input portion of the amplifier transistor to a reset potential. The reset potential here has a value dropped from a power supply voltage by a predetermined amount.

The amplifier transistor 104 has a drain connected to the power line VDD, a source connected to a drain of the select transistor 105, and a gate connected to the FDs. The amplifier transistor 104 functions as an input transistor of the source follower circuit. An amplifier transistor amplifies a signal based on signal charges occurring in a plurality of photoelectric conversion components. More specifically, an amplifier transistor converts charges to a voltage for impedance transformation. The input portion of an amplifier transistor includes a gate and an FD connected to the gate.

The select transistor 105 has a drain connected to the source of the amplifier transistor 104, a source connected to the vertical signal line (output line) 106, and a gate connected to a select control line. However, the select transistor 105 and the amplifier transistor 104 are to be connected in series. In other words, the select transistor may have a drain connected to a power supply and a source connected to the drain of the amplifier transistor.

FIG. 1 illustrates a unit cell in which two pixels (two photodiodes) share the reset transistor, amplifier transistor, and select transistor. More pixels may share in a unit cell.

Figure 2:
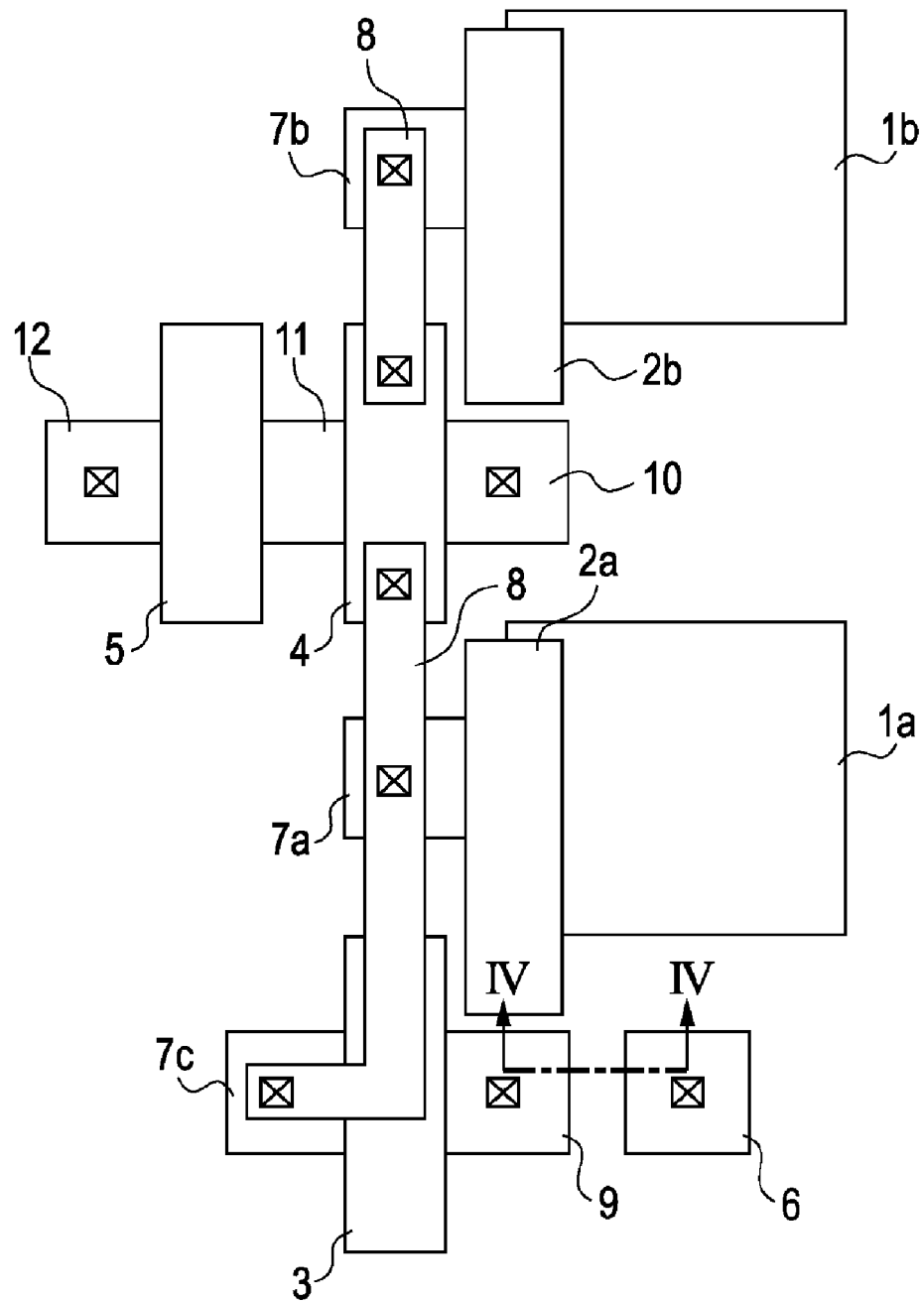
FIG. 2 is a plan layout diagram of a solid-state imaging apparatus of the present invention.

FIG. 2 is a layout diagram of a solid-state imaging apparatus of the present invention. FIG. 2 illustrates a layout for 2 pixels.

FIG. 2 illustrates n-type regions 1a and 1b of the photodiodes constituting the photoelectric conversion components. The n-type regions 1a and 1b and p-type regions, not illustrated, form PN junctions. A p-type region for suppressing dark current may be provided on a surface of the n-type regions.

FIG. 2 further illustrates transfer gate electrodes 2a and 2b which transfer signal charges in the photodiodes to the FDs, a gate electrode 3 of the reset transistor, a gate electrode 4 of the amplifier transistor, and a gate electrode 5 of the select transistor.

FIG. 2 further illustrates a well contact region 6 containing a p-type region. A plurality of well contact regions are provided within a pixel region, and a well contact region is provided in each unit cell. The well contact region is a region for supplying reference voltage such as a ground potential to the p-type regions contained in the photodiodes and a p-type region for providing a channel part for the transistors in a pixel. The well contact region receives the reference voltage through a plug and a wiring.

FIG. 2 further illustrates FD regions 7a and 7b each containing an n-type region. In the FD regions 7a and 7b, signal charges generated in the photodiodes are transferred by a bias supplied to the transfer gates. The FD regions are, as described above, connected to the gate of the amplifier transistor.

FIG. 2 further illustrates a source region 7c of the reset transistor. The source region 7c contains an n-type region. The source region 7c is connected to the FD regions 7a and 7b and the gate electrode 4 of the amplifier transistor through a wiring 8. The capacitance including parasitic capacitances formed by the FD regions 7a and 7b, source region 7c of the reset transistor, wiring 8 and a surrounding insulating layer or the like converts the transferred signal charges to voltage.

FIG. 2 further illustrates a drain region 9 of the reset transistor and a drain region 10 of the amplifier transistor. The drain regions 9 and 10 contain n-type regions. The drain region of the reset transistor contains a region having a lower concentration than that of the source and drain regions of at least the select transistor, as will be described later. The drain region 9 of the reset transistor and the drain region 10 of the amplifier transistor receive power supply voltage VDD.

FIG. 2 further illustrates a source region 11 of the amplifier transistor. The source region 11 contains an n-type region. The source region 11 also functions as the drain region of the select transistor. FIG. 2 further illustrates a source region 12 of the select transistor. The source region 12 contains an n-type region.

Figure 3:
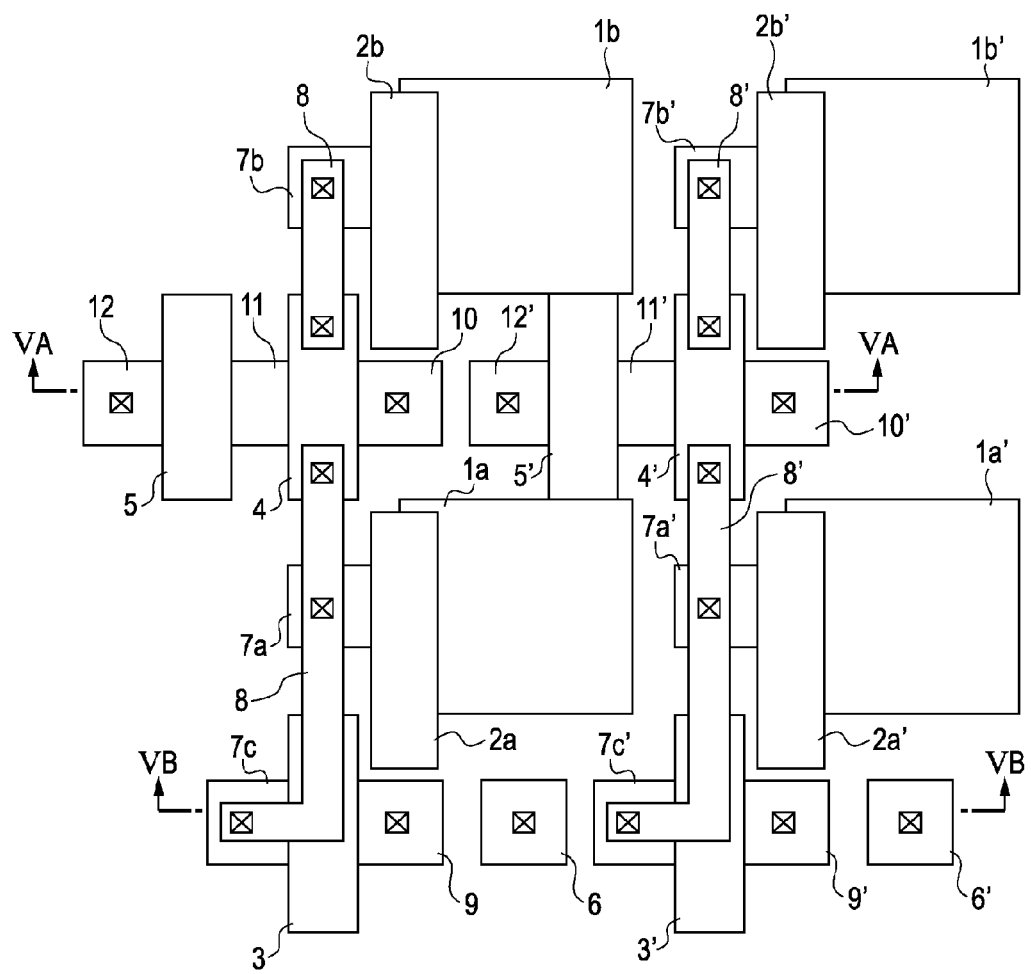
FIG. 3 is a plan layout diagram of a solid-state imaging apparatus of the present invention.

FIG. 3 is a layout diagram in which the unit cell in FIG. 2 is disposed in an array form. Illustrating unit cells in neighboring pixel columns in FIG. 3, more unit cells are disposed in a matrix. The well contact region 6 is neighboring to the drain region 9 of the reset transistor through an isolation region and is neighboring to a source region 7c' of the reset transistor in the neighboring pixel column through an isolation region. More generally, a well contact region is neighboring to a drain region of a reset transistor in a first pixel column through an isolation region. The well contact region is further neighboring to a source region of the reset transistor in a second pixel column neighboring to the first pixel column through an isolation region.

On the layout in FIG. 3, the amplifier transistor and select transistor are disposed on the upper side (a first region) of the photoelectric conversion component 1a. The FD region is disposed on the left-hand side (second region) of the photoelectric conversion component 1a. The FD region of the neighboring pixel column is disposed on the right-hand side (third region) of the photoelectric conversion component 1a. The third region is opposed to the second region across the photoelectric conversion component 1a. The reset transistor and well contact region are disposed on the lower side (fourth region) of the photoelectric conversion component 1a. The fourth region is opposed to the third region across the photoelectric conversion component 1a.

The source and drain of the reset transistor may be replaced by each other in some voltage relationships between the nodes. However, during a reset operation, the region connected to power supply voltage functions as the drain region, and the region connected to the FD region functions as the source region.

In order to read a signal from the pixels, current is fed to the serially connected amplifier transistor 104 and select transistor 105. In this case, the current flowing in the select transistor causes a voltage drop, and the dynamic range is reduced by the amount equivalent to the resistance of the select transistor. Thus, the resistance of the select transistor is to be as small as possible. In order to do so, the source and drain regions of the select transistor have a higher impurity concentration within a withstand voltage range. Generally from the viewpoint of manufacturing processes and circuit resistance, other transistors included in a pixel have source and drain regions having a higher impurity concentration like the select transistor.

However, as illustrated in FIGS. 2 and 3, when the drain region of the reset transistor and the well contact region 6 are disposed closely, a high impurity concentration of the source and drain regions of the reset transistor may not be desirable. This point will be described in more detail.

Figure 4A:
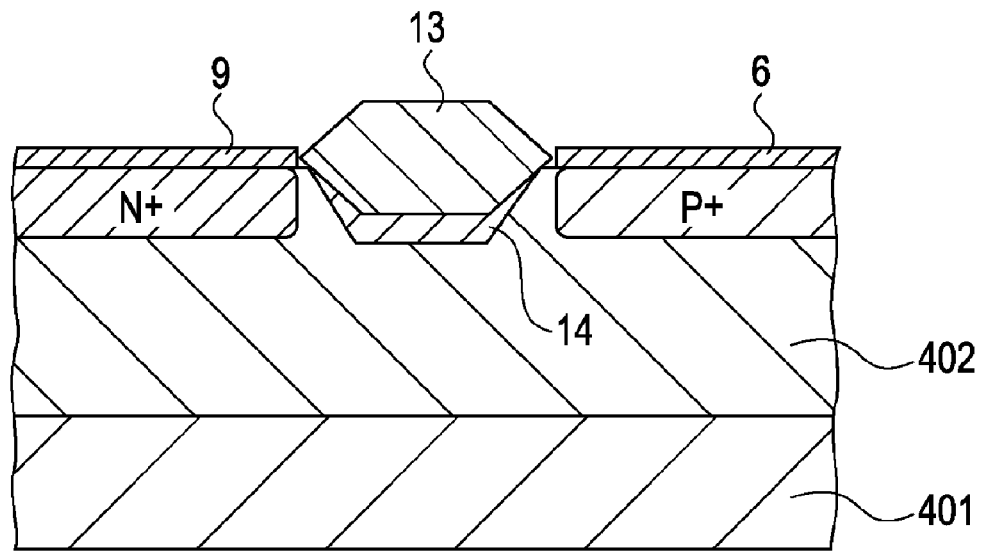
FIGS. 4A and 4B illustrate section views taken on the line IV-IV in FIG. 2.
Figure 4B:
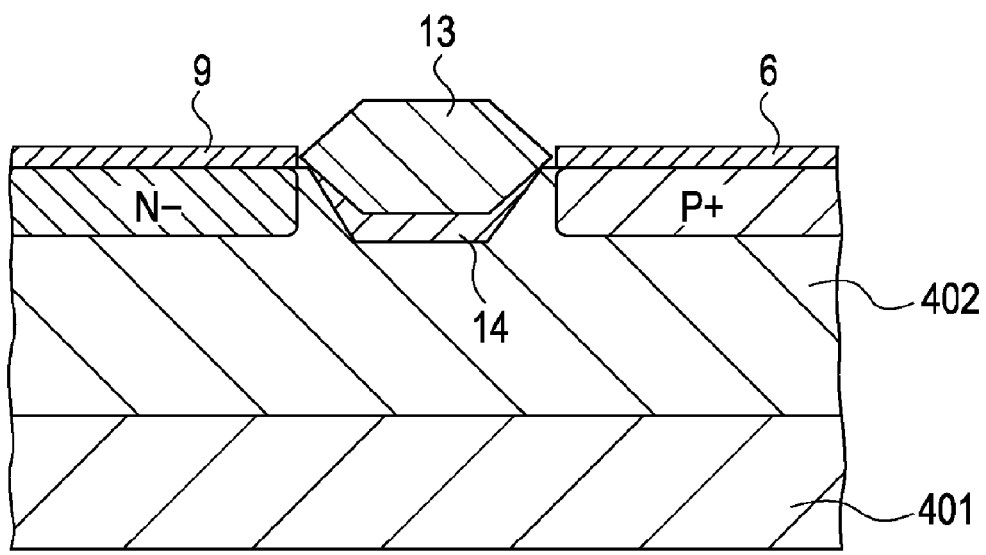

FIG. 4B illustrates the section view taken on the line IV-IV in FIG. 2. FIG. 4A illustrates an example for a comparison purpose in which the present invention is not implemented. Like numerals refer like parts to those in FIGS. 2 and 3, and the detailed descriptions will be omitted.

FIG. 4A illustrates an n-type semiconductor substrate 401 and a p-type region (P-well) 402 for providing a channel part for the transistors in the pixel. A P-well is also provided at a position functioning as a region forming a PN junction of a photodiode.

FIG. 4A further illustrates an isolation region 13 and a channel stop region 14 under the isolation region. The isolation region 13 is provided for separating active regions of the semiconductor substrate. The channel stop region 14 contains a heavily doped p-type region and is provided for suppressing the flow of a leak current through a channel occurring between neighboring active regions. In a solid-state imaging apparatus, the channel stop region also suppresses injection of a dark current occurring near an interface of an isolation region into a path where a signal current flows.

When the drain region 9 contains a heavily-doped n-type region, like the source and drain regions of the select transistor, a high electric field occurs between the drain region 9 and the channel stop region 13 forming a PN junction, thus allowing easy flow of a leak current in the opposite direction. Even light may be emitted therefrom. This becomes noise and may reduce the image quality.

On the other hand, FIG. 4B is a section view with the application of the present invention. The lower impurity concentration of the drain region 9 of the reset transistor than that of the source and drain regions of the select transistor can moderate the electric field between the drain region 9 and the channel stop region 13. In FIG. 4A, the heavily doped n-type region and the heavily doped p-type region directly form a PN junction. On the other hand, in FIG. 4B, a lightly doped n-type region and a heavily doped p-type region form a PN junction. This configuration can suppress a leak current and suppress light emission. When the positions of the source and drain regions of the reset transistor in FIGS. 2 and 3 are replaced by each other, the source region may be lightly doped. In other words, one of the source and drain regions of at least the reset transistor disposed closely to a well contact region may be lightly doped.

The impurity concentration of the drain region of the reset transistor in FIG. 4B may be in the range of 1E17 to 1E19 ($cm^{-3}$), and the ion implantation may be performed with a dose between 5E12 and 5E14 ($cm^{-3}$).

The lower impurity concentration of the source region 7c of the reset transistor can also reduce the parasitic capacitance occurring at the node to which the FD 7 is connected. This results in an improved efficiency of the charge/voltage conversion from signal charges read from the photodiodes 1a and 1b to the FD 7 to signal voltage. It further contributes to improvement of the S/N ratio of the solid-state imaging apparatus.

Figure 5A:
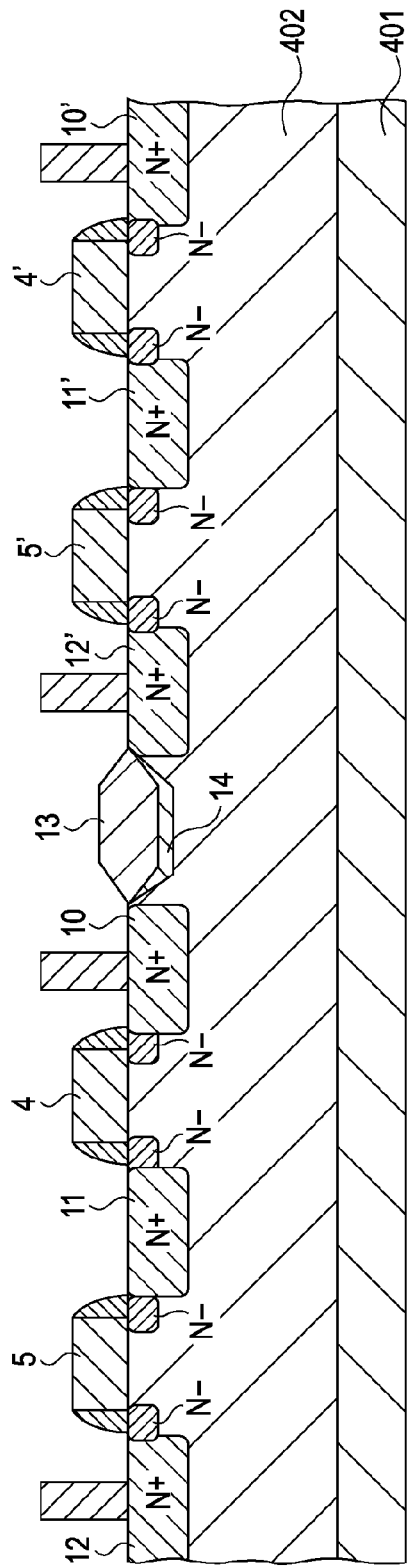
FIGS. 5A and 5B illustrate section views taken on the lines VA-VA and VB-VB in FIG. 3.
Figure 5B:
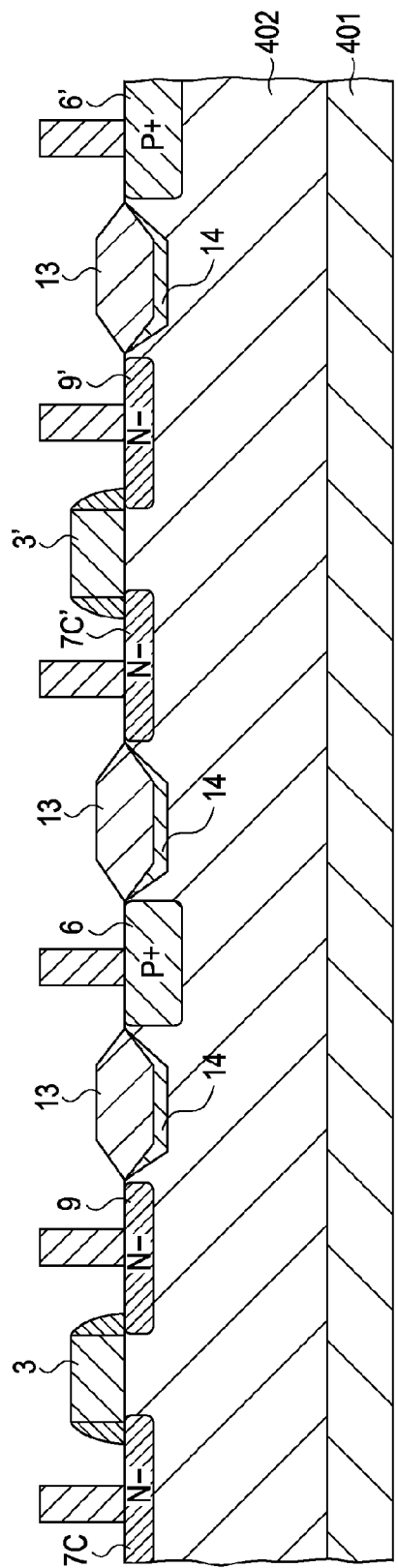

Next, FIG. 5A illustrates a section view taken on the line VA-VA in FIG. 3, and FIG. 5B illustrates a section view taken on the line VB-VB in FIG. 3. Like numerals refer to like parts to those in FIGS. 1 to 4B, and detailed descriptions will be omitted. FIG. 5A illustrates a cross-section in the parallel direction to the channel length of the select transistor and amplifier transistor. FIG. 5B illustrates a cross-section in the parallel direction to the channel length of the reset transistor and of the well contact region.

As illustrated in FIG. 5A, the source and drain regions of the select transistor and amplifier transistor contain a lightly doped region closely to the gates and a heavily doped region remotely from the gates. A what is called an LDD structure is provided including a large part of the source and drain regions containing a heavily doped region and a part close to the gate electrode containing a lightly doped region, for improvement of breakdown voltage.

On the other hand, as illustrated in FIG. 5B, the source and drain regions of the reset transistor contains a region having a lower concentration than that of the source and drain regions of the select transistor. Thus, the part forming a PN junction together with the channel stop region closely disposed to the well contact region has a lower concentration. This can suppress the electric field intensity to be applied to the part. The region having a lower concentration may be formed in the same step as the region having a low concentration of the LDD structure of the select transistor. In this case, the manufacturing process can be simplified.

In addition to the source and drain regions of the reset transistor, the FD regions 7a and 7b may have a lower impurity concentration than the impurity concentration of the source and drain regions of the select transistor. This configuration can reduce the parasitic capacitance occurring in a node to which the FDs are connected and can improve the efficiency of charge/voltage conversion. In this case, the FD regions may be produced in the same ion implantation step as that for the source and drain regions of the reset transistor.

As described above, the present invention can moderate the electric field between a well contact and a drain region of a reset transistor, without narrowing the dynamic range of signals.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-149804 filed Jun. 24, 2009, which is hereby incorporated by reference herein in its entirety.

What is claimed is:

1. An apparatus comprising:
a pixel region having disposed therein in a matrix form unit cells including a plurality of conversion components, an amplifier transistor which amplifies a signal based on signal charges occurring in the plurality of conversion components, a reset transistor which sets a potential of an input portion of the amplifier transistor to a reset potential, and a select transistor which is connected in series to the amplifier transistor and selects and reads the amplified signal; and
a plurality of well contact regions which are provided within the pixel region and supply a reference voltage to a well providing a channel part of the amplifier transistor, the reset transistor and the select transistor, wherein
each of the well contact regions is neighboring to a drain region of the reset transistor through an isolation region having a channel stop region under the isolation region; and
at least one of a source region and a drain region of the reset transistor has a lower impurity concentration than the impurity concentration in a source region and a drain region of the select transistor.

2. The apparatus according to claim 1, wherein the conversion component are photoelectric conversion components.

3. The apparatus according to claim 2, wherein the input portion includes a gate and a diffusion region of a first conduction type which is connected to the gate, and the impurity concentration in the diffusion region is lower than the impurity concentration of the source region and the drain region of the select transistor.

4. The apparatus according to claim 2, wherein the select transistor has an LDD structure, and the drain region of the reset transistor has a lower impurity concentration than that in a heavily doped region of the drain region included in the LDD structure.

5. The apparatus according to claim 2, wherein each of the well contact regions is neighboring to the drain region of the reset transistor in a first unit cell included in a first pixel column through an isolation region and is neighboring to the source region of the reset transistor in a second unit cell included in a second pixel column neighboring to the first pixel column through an isolation region.

6. An method comprising:
amplifying, by an amplifier transistor, a signal based on signal charges occurring in a plurality of conversion components;
setting, by a reset transistor, a potential of an input portion of the amplifier transistor to a reset potential;
selecting and reading the amplified signal by a select transistor which is connected in series to the amplifier transistor; and
supplying, a plurality of well contact regions within the pixel region, a reference voltage to a well, wherein:
the well provides a channel part of the amplifier transistor, the reset transistor and the select transistor,
each of the well contact regions is neighboring to a drain region of the reset transistor through an isolation region having a channel stop region under the isolation region, and
at least one of a source region and a drain region of the reset transistor has a lower impurity concentration than the impurity concentration in a source region and a drain region of the select transistor.

7. The method according to claim 6, wherein the conversion component are photoelectric conversion components.

8. The method according to claim 7, further comprises connecting a gate of the input portion to a diffusion region of a first conduction type, wherein the impurity concentration in the diffusion region is lower than the impurity concentration of the source region and the drain region of the select transistor.

9. The method according to claim 7, wherein the select transistor has an LDD structure, and the drain region of the reset transistor has a lower impurity concentration than that in a heavily doped region of the drain region included in the LDD structure.

10. The method according to claim 7, wherein each of the well contact regions is neighboring to the drain region of the reset transistor in a first unit cell included in a first pixel column through an isolation region and is neighboring to the source region of the reset transistor in a second unit cell included in a second pixel column neighboring to the first pixel column through an isolation region.

* * * * *